United States Patent [19]
Wilt et al.

[11] Patent Number: 5,469,294
[45] Date of Patent: Nov. 21, 1995

[54] ILLUMINATION SYSTEM FOR OCR OF INDICIA ON A SUBSTRATE

[75] Inventors: Donald R. Wilt, Lexington; Richard S. Sidell, Needham, both of Mass.

[73] Assignee: XRL, Inc., Canton, Mass.

[21] Appl. No.: 98,136

[22] Filed: Jul. 26, 1993

Related U.S. Application Data

[63] Continuation-in-part of Ser. No. 877,843, May 1, 1992, Pat. No. 5,231,536.

[51] Int. Cl.$^6$ ................................................ C02B 27/02
[52] U.S. Cl. .......................... 359/436; 359/385; 356/401; 250/237 R
[58] Field of Search ..................... 359/436, 438, 359/439, 440, 385, 390, 391, 392, 393, 368, 372–373; 356/359, 360, 363, 356, 401, 237; 250/237 R, 237 G, 227.29, 227.30, 548, 560, 578.1

[56] References Cited

U.S. PATENT DOCUMENTS

| | | |
|---|---|---|
| 3,920,311 | 11/1975 | Tsuda et al. |
| 3,930,713 | 1/1976 | Stankewitz et al. |
| 4,127,318 | 11/1978 | Determann et al. |
| 4,232,937 | 11/1980 | Swaminathan et al. |
| 4,329,014 | 4/1982 | Reinheimer et al. |
| 4,367,463 | 1/1983 | Suzuki et al. ............................ 34/700 |
| 4,585,315 | 4/1986 | Sincerbox et al. |
| 4,601,551 | 7/1986 | Pettingell et al. ......................... 359/387 |
| 4,697,087 | 9/1987 | Wu ............................................. 250/548 |
| 4,704,027 | 11/1987 | Phillips .................................... 355/43 |
| 4,871,257 | 10/1989 | Suzuki et al. .............................. 356/400 |
| 4,881,802 | 11/1989 | Stankewitz . |
| 4,939,376 | 7/1990 | Woodruff et al. ........................ 356/236 |
| 5,265,170 | 11/1993 | Hine et al. ................................... 382/8 |

OTHER PUBLICATIONS

Brochure entitled "IFS-1 Image Formation System" of Proofline, Inc., P.O. Box 36053, San Jose, Calif. 95158, 4 pages (undated but believed to have been published by 1989–1990).

Primary Examiner—Vincent P. McGraw
Assistant Examiner—K. P. Hantis
Attorney, Agent, or Firm—Weingarten, Schurgin, Gagnebin & Hayes

[57] ABSTRACT

An illumination system is provided having one or more light sources, opaque baffles, and mirrors for illuminating indicia on a substrate, such as a semiconductor wafer, for viewing by a camera aligned parallel with or at an angle to the substrate. The light sources include light emitting diodes (LEDs) for illuminating soft marks and broad spectrum incandescent lamps for illuminating hard marks. Dark field and light field illuminators are provided for enhanced reading of light indicia on a dark background and dark indicia on a light background, respectively. A light control unit allows for manual or automated control of light source selection and light intensity.

12 Claims, 6 Drawing Sheets

ILLUMINATION SYSTEM FOR OCR OF INDICIA ON A SUBSTRATE

CROSS-REFERENCE TO RELATED APPLICATIONS

The instant invention is a continuation-in-part of commonly-assigned patent application Ser. No. 07/877,843, filed May 1, 1992, now U.S. Pat. No. 5,231,536.

FIELD OF THE INVENTION

The instant invention is drawn to the field of optics, and more particularly, to an LED illumination system for optical character recognition of indicia on a substrate.

BACKGROUND OF THE INVENTION

Semiconductor wafers and other substrates may be provided with indicia that indicate, among other things, wafer number and manufacturer. The indicia may be, for example, ¾ to ⅝ inches in length, and are typically constituted as a matrix of laser-etched pits.

The difficulties in providing machine reading of such laser-etched indicia on semiconductor wafers arise from the fact that the characters themselves are the same color as their wafer substrates and show little relief, from the fact that the wafer surface is polished, so that it reflects thereof the light used to read the characters, and from the fact that the surface of the wafer may undergo several coating processes which cover the characters and reduce their size and relief.

The heretofore known optical character recognition systems have utilized the small surface irregularities introduced by the indicia to reflect light to a camera. But because the dots are so smooth, they disperse light only through a small angle, and in some instances, extremely small angles. As a result, the source of the light must be at a very small angle from the line of sight and it must be relatively intense. This places the source in the camera's field of view and the result is, in many instances, that the camera is blinded. While prior art techniques which use beam splitters to direct light along the line of sight have been utilized, these techniques have not been robust enough to illuminate small characters with many overcoat layers. High intensity fiber optic light sources represent another prior art technique that, while providing very intense light which functions at greater angles and illuminates even the most difficult characters, is subject to the considerable disadvantage that they are expensive, large, and generate unwanted heat and vibration.

SUMMARY OF THE INVENTION

Accordingly, it is the principal object of the present invention to provide a robust, but inexpensive, light emitting diode (LED) illumination system-for optical character recognition of indicia on a substrate, even when the characters have been overcoated with one or more layers.

In accord therewith, and in one embodiment, a camera having a field of view that is angled at a first acute angle to a normal to the substrate is provided for reading the indicia thereon within its field of view. First and second arrays of light emitting diodes each defining optical paths that are respectively disposed to either side of a second acute angle to the normal to the substrate, where the second acute angle is the same in magnitude as the first acute angle but is to the other side of the normal, are provided for illuminating the indicia on the substrate. First and second baffles respectively disposed along the optical paths of the first and second arrays of light emitting diodes are provided to occlude the respective light emitting diode arrays and thereby prevent them from being imaged within the field of view of the camera while allowing the indicia to be read by the camera in the light of the LED arrays.

In further accord therewith, and in another embodiment, a camera having a field of view that is oriented with its long axis in parallel relation with a normal to the substrate is provided for reading the indicia thereon within its field of view. An optical member optically confronting both the camera and the substrate is provided for deviating light incident thereto to and towards the camera. The optical member may be a plane mirror angled to confront both the camera and the substrate, a double plane mirror, a first mirror member of which is angled to confront the substrate and a second mirror member of which is angled to confront both the camera and the first mirror member, and may be a prism. First and second arrays of light emitting diodes defining optical paths that are respectively disposed to either side of an acute angle defined with respect to a normal to the substrate are provided for illuminating the indicia on the substrate. First and second baffles respectively disposed along the optical paths of the first and second arrays of LEDs are provided to occlude the respective LED arrays and thereby prevent them from being imaged within the field of view of the camera while allowing the indicia to be read by the camera in the light of the LED arrays.

In these embodiments, the LED arrays may include one lens, multiple lenses, or no lens. Additionally, a mask may be provided in the nearfield of the LED arrays to allow placing comparatively-large and readily-available LEDs closer to the substrate without imaging them within the camera's field of view, while reducing overall package size.

In still another embodiment, a camera having a field of view that is oriented with its longitudinal axis in perpendicular relation with a normal to the substrate is provided for reading the indicia thereon within its field of view. A plurality of optical elements are arranged so that one of the elements confronts first and second arrays of LEDs to direct light emanating therefrom between baffles arranged to occlude the lamp arrays from other optical elements and thenceforth to other elements, one of which confronting the camera allowing it to read the indicia by the lamp light.

In yet another embodiment, specially configured for reading both soft and hard mark scribes, a camera having a field of view that is oriented with its longitudinal axis in perpendicular indicia thereon within its field of view. A plurality of optical elements are arranged so that one of the elements confronts first and second arrays of LEDs to direct light emanating therefrom between baffles arranged to occlude the LED arrays from other optical elements and thenceforth to other elements, one of which confronting the camera allowing it to read the indicia by the LED light. Additionally, this embodiment includes two supplemental illumination modes for reading hard markings.

The first additional mode is dark field illumination and consists of an array of incandescent lamps mounted near the indicia on the substrate, but out of the camera's field of view.

The second mode is bright field illumination and consists of a diffuse, preferably white, reflector located in the camera's field of view which is illuminated by first and second arrays of incandescent lamps proximate thereto, but hidden from the camera's view. The reflector is mounted between the first and second arrays of LEDs and in front of the mask used for soft mark illumination. The lamp arrays are placed adjacent to the LED arrays in a manner to provide uniform illumination of the reflector. The reflector is limited in size to that just sufficient to provide a bright background for the scribe window. All other light is blocked from the wafer and the camera's view by lamp housings and the baffles utilized for soft mark illumination. Minimizing the size of the reflector and blocking all other light from the wafer maximizes the contrast between the polished wafer surface, which reflects a clear image of the bright reflector, and the scribe marks which scatter the light and thus appear dark. If the reflector were larger than the scribe window, or if stray light from the lamps were allowed to illuminate the wafer, then the image contrast would be diminished due to the additional light scattered from the scribes entering the camera and making them appear brighter.

The invention provides a multi-channel light control unit controlling four illumination sources responsive to operator input and control logic for selecting an appropriate source and intensity of illumination to provide enhanced viewing of a variety of scribes. The control unit can be either hard-wired or include user programmable software which can adjust the illumination sources in response to camera feedback.

BRIEF DESCRIPTION OF THE DRAWINGS

These and other objects, features and advantages of the present invention will become apparent upon reference to the following detailed description of the preferred embodiments and to the drawings wherein.

DETAILED DESCRIPTION OF THE PREFERRED EMBODIMENTS

Figure 1:
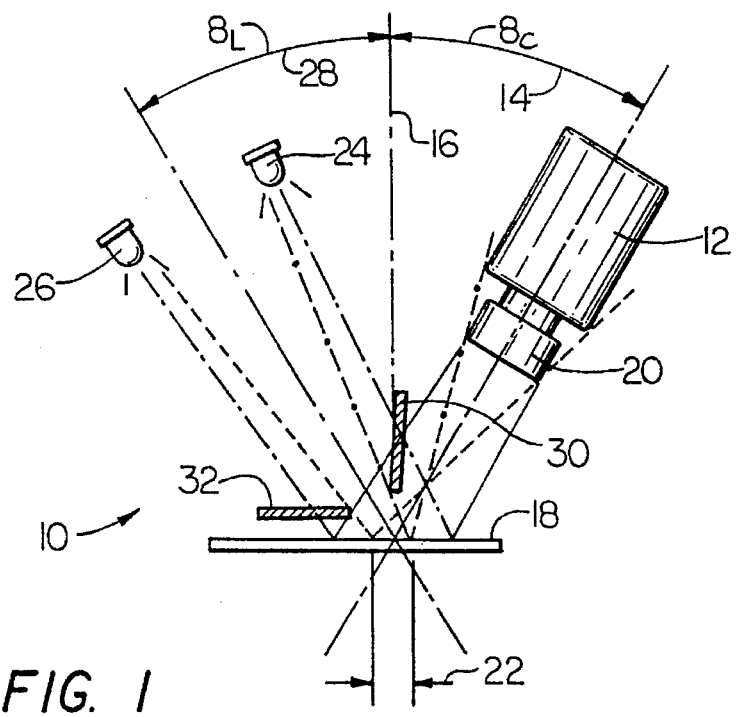
FIG. 1 is a partially-pictorial partially-sectional diagram illustrating one embodiment of the robust LED illumination system for OCR of indicia on a substrate in accord with the present invention.

Referring now to FIG. 1, generally designated at 10 is a schematic diagram illustrating one embodiment of the robust LED illumination system for optical character recognition (OCR) of indicia (such as, laser-etched character strings) on a substrate (such as, semiconductor wafers). A camera 12 is provided at an acute angle marked "$\Theta_c$" and generally designated by arrow 14 that is defined with respect to a normal 16 to a semiconductor wafer 18. The camera 12 has a lens 20 that has a field of view that reads indicia, schematically illustrated by arrows 22, on the wafer 18.

First and second arrays of light emitting diodes, each of which are evenly distributed across the full width of the cameras field of view, are respectively disposed to either side of a second acute angle marked "$\Theta_L$" and generally designated by an arrow 28. The angle of the acute angle 28 is the same in magnitude as that of the angle of the acute angle 14, but the second acute angle is to the other side of the normal 16 to the substrate 18. Each of the LEDs of the LED arrays 24, 26 preferably are lensed, although unlensed LEDs together with separate cylindrical lenses may be provided as well. The number of LEDs is selected to provide robust illumination of the indicia 22 on the substrate 18. They are each arrayed in linear alignment to conform to the typically linear arrangement of the indicia 22. Other patterns are possible.

Each of the LED arrays 24, 26 provide optical paths along which their respective light beams illuminate the indicia on the substrate, one to either side thereof. Along the optical path of the array 24 an opaque baffle 30 is disposed, and along the optical path of the LED array 26 an opaque baffle 32 is disposed; the baffles 30, 32 are spaced-apart a preselected distance. The baffle 30, which may be any opaque material such as aluminum, is oriented such that its normal is orthogonal to the normal 16 to the wafer 18, and the baffle 32 is oriented such that its normal is parallel to the normal 16 to the substrate 18, although other orientations thereof are possible so long as the direct images of the corresponding arrays are occluded by the corresponding baffle from being imaged off the specular surface of the substrate 18 and thereby picked up by the field of view of the lens 20 of the camera 12 while allowing the indicia 22 to be read therefrom in the light of the illumination provided by the LED arrays 24, 26.

Figure 2:
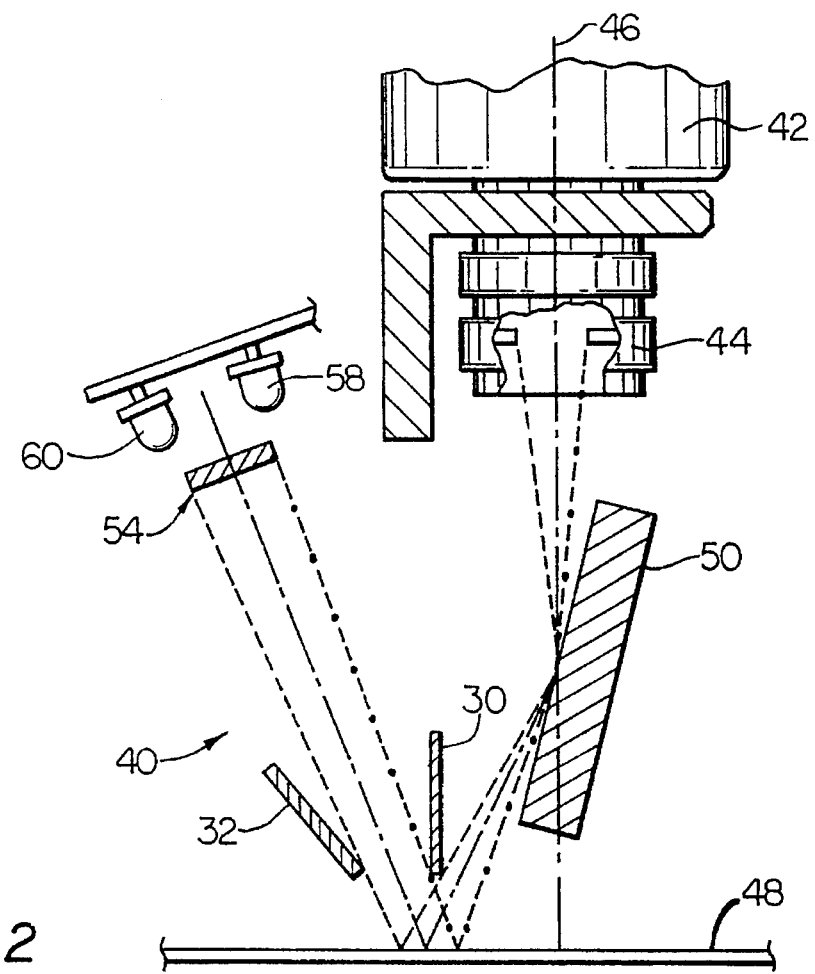
FIG. 2 is a partially-pictorial partially-sectional diagram illustrating another embodiment of the robust LED illumination system for OCR of indicia on a substrate in accord with the present invention.

Referring now to FIG. 2, generally designated at 40 is another embodiment of the robust LED illumination system for optical character recognition of indicia on a substrate in accord with the present invention. The embodiment 40 of FIG. 2 differs from the embodiment 10 of FIG. 1 in two principal respects. The first respect is that the camera 42 having the lens 44 providing a field of view is mounted with the axis of the camera generally parallel to the normal 46 to the substrate 48, and an optical member 50, such as a planar mirror, is disposed within the field of view of the lens 44 of the camera 42 at a preselected acute angle. The angle at which the mirror is oriented within the field of view of the lens 44 is selected to deviate light reflected off the surface of the wafer 48 into the lens 44 of the camera 42, while allowing the camera 42 to be in the vertical position illustrated. The vertical orientation of the camera, among other advantages, enables a reduction in package size and simplifies mounting.

The second respect in which the embodiment 40 of FIG. 2 differs from that of the embodiment 10 of FIG. 1 is that a mask 54 having a rectangular shape is provided in the nearfield of the LED arrays 58, 60. The mask 54 allows placing large LED's, which are readily commercially available, much closer to the substrate 48, typically a semiconductor wafer, without their being visible within the camera's field of view.

In this embodiment, the individual light emitting diodes of the light emitting diode arrays are preferably lensed, although cylindrical lenses may be added to unlensed LEDs to provide more uniform illumination along the optical paths of the LEDs of the arrays of LEDs.

Figure 3A:
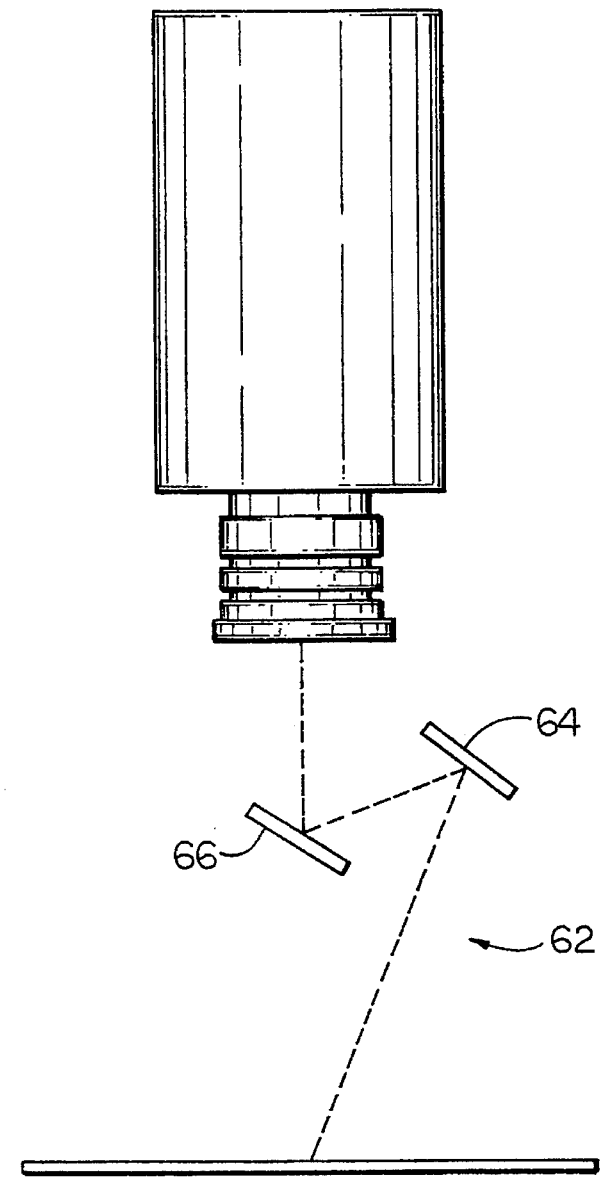
FIG. 3 in the FIG. 3A, 3B thereof are sectional diagrams illustrating alternative optical members useful in the FIG. 2 embodiment of the robust LED illuminator system for OCR of indicia on a substrate in accord with the present invention.

As seen in FIG. 3A, a double plane mirror generally designated 62 may be provided in place of the plane mirror 50 (FIG. 2) to deviate light reflected off the substrate to the camera. A first planar mirror member 64 thereof is angled to confront the substrate and a second planar mirror member 66 thereof is angled to confront both the mirror member 64 and the camera. The double reflections thereof present a true image of the indicia to be read.

Figure 3B:
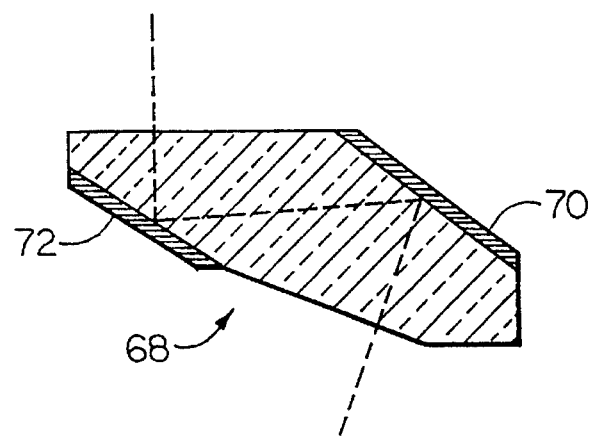

As seen in FIG. 3B, a prism generally designated 68 may be provided in place of the plane mirror 50 to deviate light reflected off the substrate to the camera. The prism 68 has silvered surfaces 70, 72 that function as the members 64, 66 (FIG. 3A) function to image the substrate within the field of view of the camera.

In addition to overcoming the difficulties in reading characters that are overcoated, an optical character recognition system can be faced with the challenge of reading characters that have been created by any of a variety of marking means that form marks having distinctive characteristics. One method of creating indicia on a substrate is with a laser. Depending on the laser technique, the marks produced thereby can be "soft" marks, characterized by shallow depressions in the wafer with smooth, curved edges, or "hard" marks that are more crater-like with very sharp edges and a jagged rim at the wafer surface.

Figure 4:
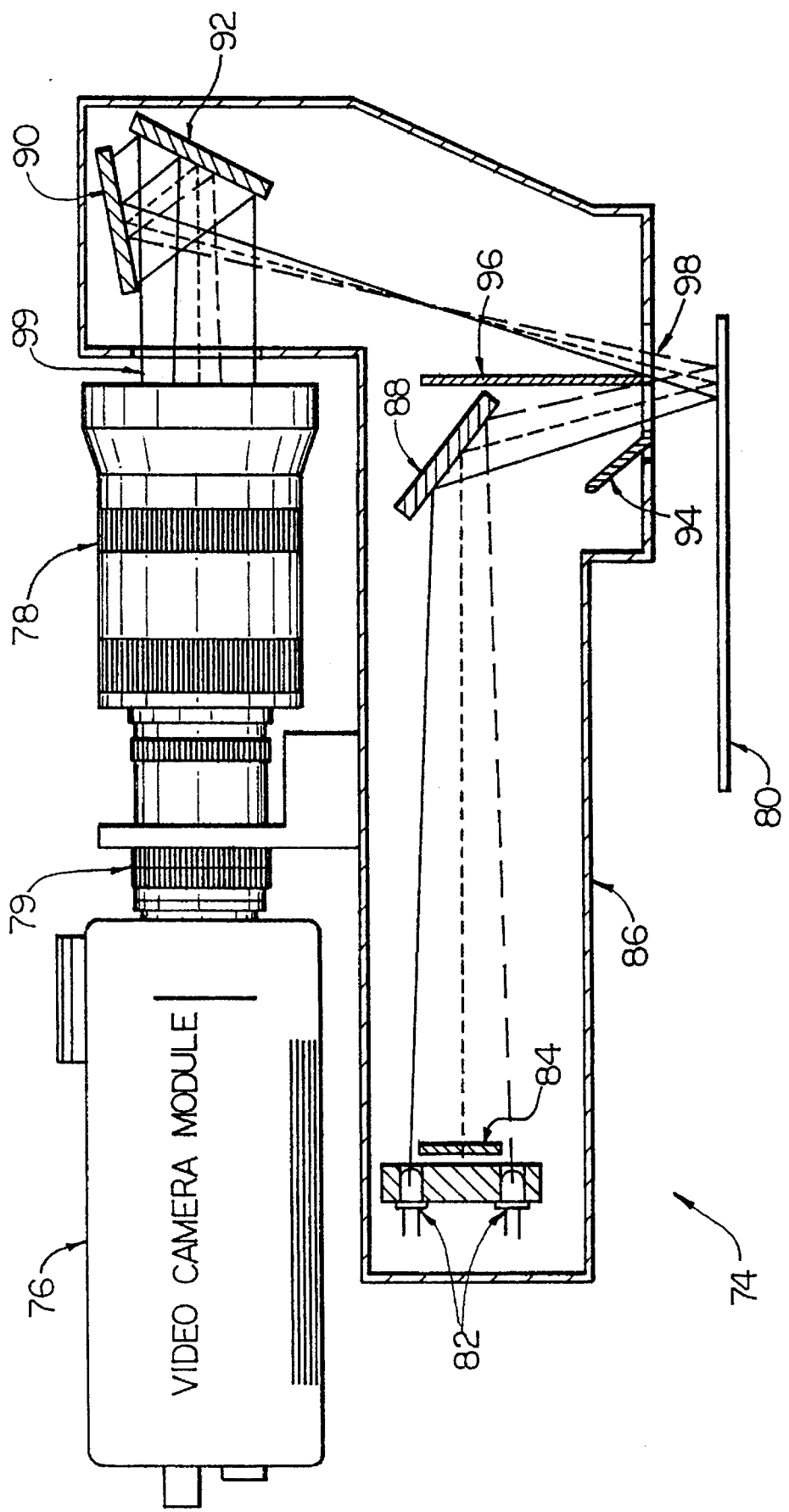
FIG. 4 is a partially-pictorial partially-sectional diagram illustrating another embodiment of an illumination system for OCR of indicia on a substrate in accord with the present invention.

Referring to FIG. 4, generally designated at 74 is another embodiment of the illumination system. The embodiment 74 of FIG. 4 differs from the embodiment 40, of FIG. 2, in two respects. The first is that a camera 76 having lens 78 is mounted so that the axis of the camera 76 is generally perpendicular to the normal to a specular substrate 80. The second respect in which embodiment 74 of FIG. 4 differs from embodiment 40 of FIG. 2 is that a light source 82, such as an arrays of LEDs, is also positioned with its axis generally perpendicular to the normal to the substrate 80°. The horizontal placement of the camera 76 and light source 82 advantageously minimizes the overall height of the package, while providing convenient access to the camera 76 and lens 78 during installation and adjustment operations.

The light source 82 is provided with a rectangular mask 84 in the nearfield of the light source, as described with respect to the embodiment of FIG. 2. The mask 84 and light source 82 are located within an enclosure 86 that also houses a first mirror 88, a second mirror 90, a third mirror 92, a first baffle 94, and a second baffle 96. The second and third mirrors, 90 and 92 respectively can be replaced with a prism as illustrated in FIG. 3B. The enclosure 86 further includes a first opening 98, or scribe window, alignable with the marks to be read on the substrate 80, a second opening 99 with which the camera 76 is aligned to receive light reflected from the substrate 80, and mirrors 88, 90, and 92. The camera 76 is affixed to the enclosure 86 with an adjustable mounting bracket for refining the alignment of the camera 76 and lens 78 with the second opening 99.

The first planar mirror 88 is angled to confront the light source 82 and the substrate 80 so that the light striking the substrate 80 does not do so perpendicularly, but at an angle. The first and second baffles, 94 and 96 respectively, are provided to control passage of light from the first mirror 88 to the substrate 80 for illuminating the substrate and the marks thereon. Light reflected from the substrate 80 at a complimentary aspect angle to that received from the first mirror 88 passes on the side of the second baffle 96 opposite the light source 82 to the second planar mirror 90 confronting the substrate 80. The second planar mirror 90 confronting the third planar mirror 92 reflects the light received from the substrate 80 to the third mirror 92 which is angled to confront the camera lens 78. Light reflecting from the third mirror 92, passes through the second opening 99 in the enclosure 86 and thus, through the lens 78 and into the camera 76.

The size of the field of view is a function of the optical magnification of a selected lens 78, the physical size of the optical elements, and the size of an optional extension tube 79. In one embodiment, an extension tube 35millimeters long is used for a 75 millimeter lens and a 10 millimeter extension tube is used with a 50 millimeter lens. For example, a field of view approximately 1.30 inches wide is provided for a 50 millimeter lens 78 having a nominal magnification of 0.25, and a camera 76 with a 6.6×8.8 millimeter CCD. If, however, the illustrated system 74 is configured with a 75 millimeter lens 78 operating at 0.50 magnification, the size of the field of view is reduced to 0.65 inches. A field of view this size is appropriate for viewing small (0.8 millimeter tall) scribes. Modification of the extension tube 79 and camera mounting position allow small adjustments (approximately +/−10%) to be made to the magnification. Cameras with different size CCDs, lenses of different focal lengths, and different length extension tubes may be employed to obtain other magnifications. Those familiar with cameras and lenses can select the combination to provide the magnification best suited for a particular application.

Figure 5:
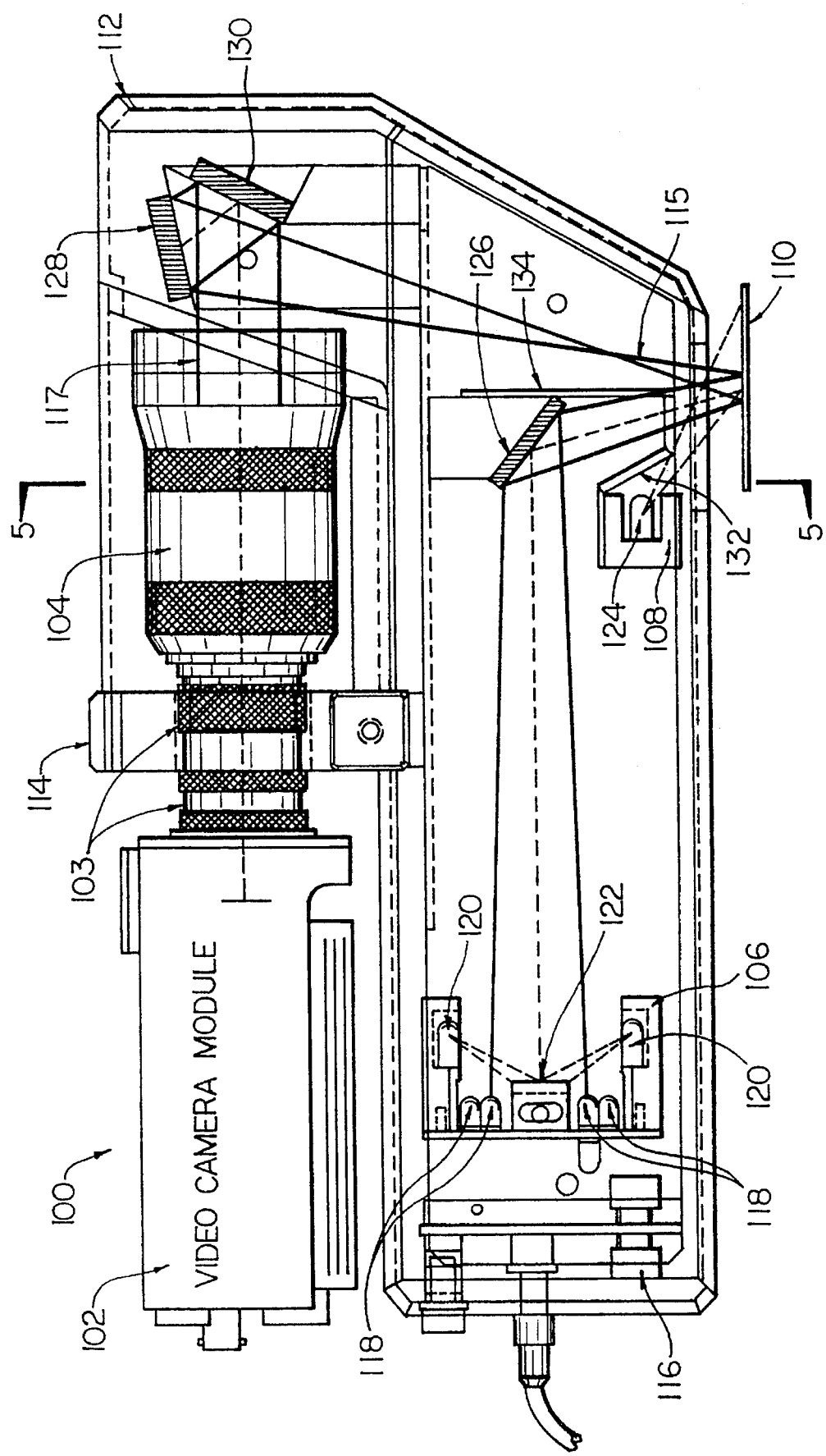
FIG. 5 is a partially-pictorial partially-sectional diagram illustrating yet another embodiment of the illumination system for OCR of indicia on a substrate.

Referring now to FIG. 5, another embodiment of an optical character recognition system 100 having a camera 102 with a 75 millimeter lens 104, an extension tube 103, a first light system 106, and a second light system 108 aligned parallel to a marked substrate 110 is illustrated. This embodiment includes LEDs for reading "soft" marks, and broad spectrum incandescent lamps for reading "hard" marks. An enclosure 112 having a mounting bracket 114 for the camera 102 is provided for housing the light systems and a four channel light control unit 116 for controlling them.

Figure 6:
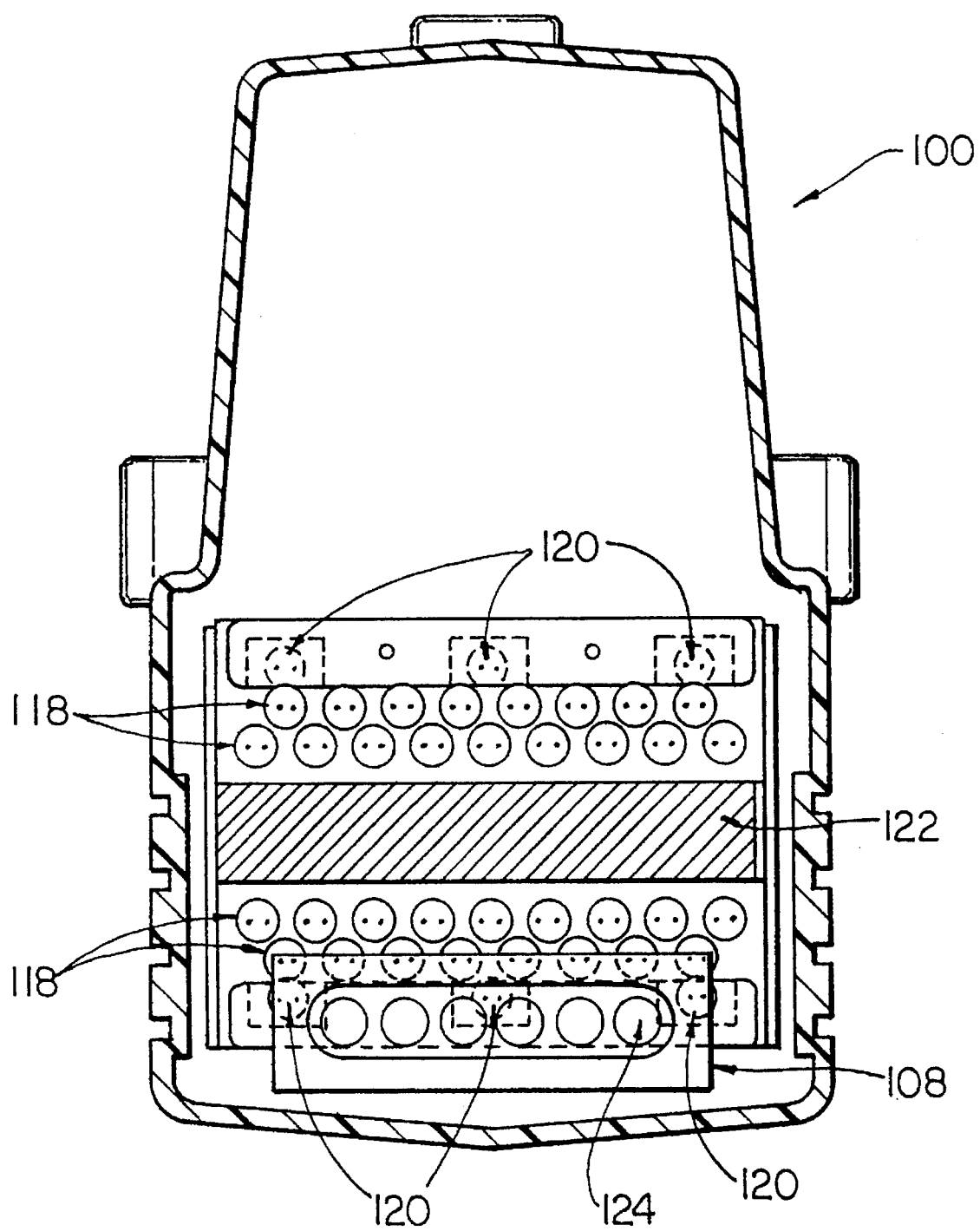
FIG. 6 is a sectional view of the illumination system of FIG. 5, taken along line 5—5.

FIG. 6 is a cross-sectional view of the illumination system of FIG. 5, which should be referred to in conjunction with FIG. 5 with regard to the following description. In the illustrated embodiment, the first light system 106 includes four rows of LEDs 118, wherein two rows are above the field of view of the camera 102 and two rows are below its field of view. The centermost or innermost two rows comprise a first array of LEDs 118 that are controlled by a first channel of the light control unit 116. The LEDs 118 of the outermost two rows comprise a second array of LEDs 118 that are independently controllable from the first array by a second channel of the light control unit 116. In the illustrated embodiment, each of the innermost rows includes nine LEDs 118 and each of the outermost rows includes eight LEDs 118.

The first light system 106 also provides for enhanced illumination of dark characters or scribes on a lightly colored background, known as bright field illumination. The bright field illumination components include two arrays of incandescent bright field lamps 120, responsive to a third channel of the light control unit 116, mounted near the LEDs 118 in light reflective housings. The bright field lamps 120 illuminate a highly-reflective, lightly-colored target 122, typically white, that is in the camera's field of view via the mirror arrangement.

The second light system 108 includes an array of incandescent lamps 124 for illuminating brightly colored characters on a dark (black) background, known as dark field illumination. In the illustrated embodiment, there are six dark field lamps 124, responsive to a fourth channel of the light control unit 116, located in a light reflective housing.

These lamps illuminate the substrate 110 and are not within the camera's field of view.

The incandescent dark field and light field lamps are standard, miniature, clear, white-light bulbs that are preferably operated at reduced voltage to extend their life, which is on the order of 20,000 or more hours. For the present application, incandescent lamps provide advantages over LEDs because they emit a broader spectrum of wavelengths, ranging from the visible well into the infrared spectrum, and are much less sensitive to interference effects which result from the thin coatings found on substrates 110 such as processed wafers. The incandescent bulbs also produce less heat than a fluorescent lamp (fluorescent lamps have "heaters" to produce the electrons necessary for the plasma discharge) and have the advantage of being easy to control in addition to their small size. Furthermore, the incandescent bulbs have electrical power requirements similar to LEDs 118 that are used for illuminating soft markings, so they are controlled by the same electronics and software.

Otherwise, the mirror and baffle arrangement, including a first mirror 126, a second mirror 128, a third mirror 130, a first baffle 132, and a second baffle 134 are the same as with respect to FIG. 4.

In each of the embodiments, the light control unit 116 controls the illumination of the substrate for optimal character resolution under a variety of viewing conditions presented by particular scribes. In one embodiment of the system 100, the light control unit 116 receives feedback from the camera 102 to automatically adjust the source and intensity of light with software controlled switching.

Figure 7:
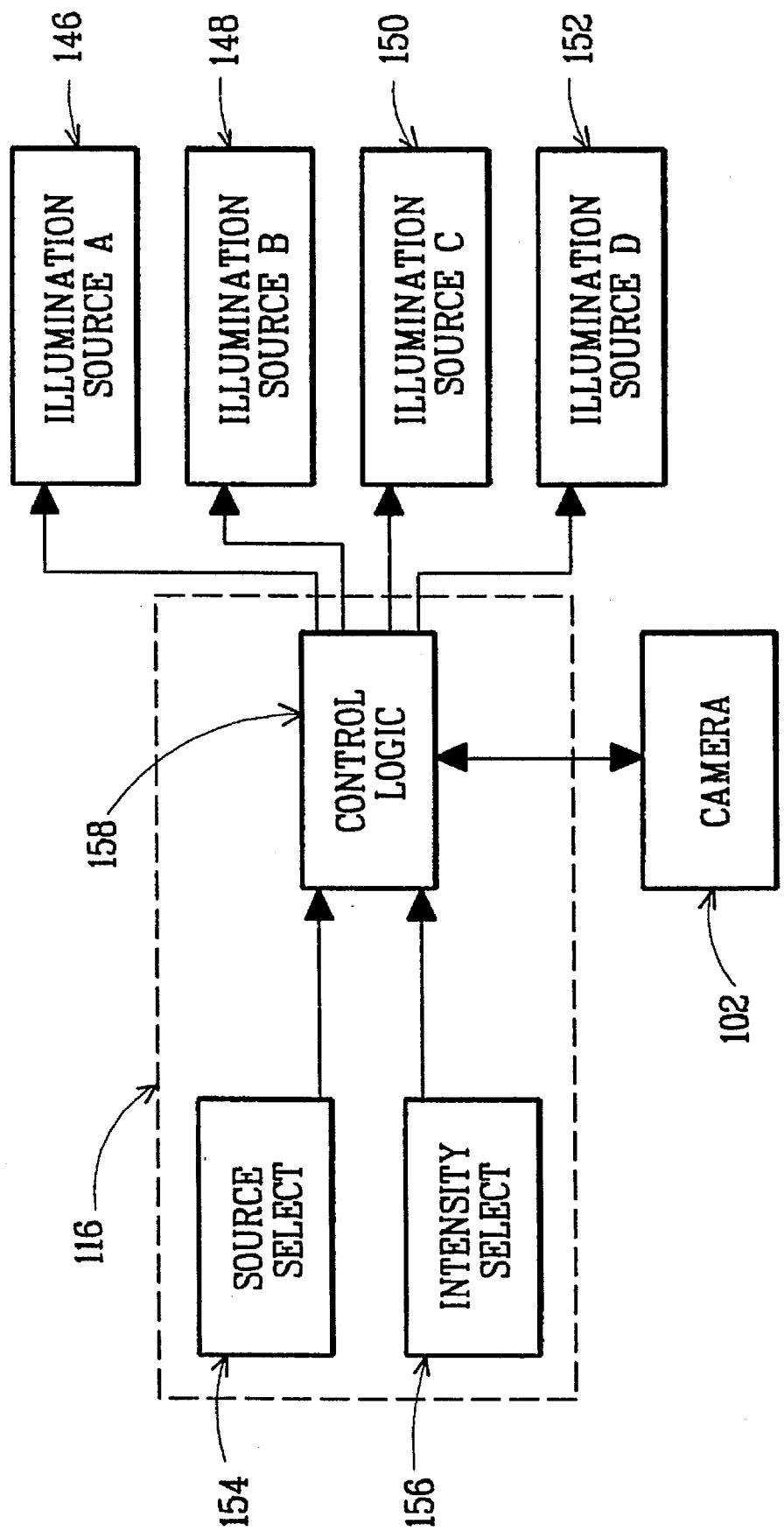
FIG. 7 is a schematic of an illumination system of the invention.

An exemplary light control unit 126 for the system 124 of FIG. 5 is illustrated schematically in FIG. 7, for control of four illumination sources A, B, C, and D, labeled 146, 148, 150, and 152 respectively to correspond to inner rows of LEDs 118, the outer rows of LEDs 118, bright field lamps 120, and dark field lamps 124. A system operator selects a source and intensity of light using source select and intensity select controls, 154 and 156, respectively. Control logic 158 is either in the form of hard wiring or software that allows a user to define both the light type and intensity by selecting appropriate commands. Accordingly, the system requires virtually no mechanical adjustment beyond initial set up for reading a wide variety of marks.

Many modifications of the presently disclosed invention will become apparent to those of skill in the art having benefitted from the instant disclosure without departing from the inventive concept.

What is claimed is:

1. An illumination system for illuminating indicia on the surface of a substrate, comprising:

a camera having a field of view that is oriented with its longitudinal axis generally perpendicular to a normal to the substrate;

first and second arrays of light sources defining optical paths that are respectively disposed to either side of an acute angle defined with respect to a normal to the substrate for illuminating the indicia on the substrate;

a first optical member confronting the first and second arrays of light sources so as to deviate light incident thereto from the first and second arrays of light sources towards the substrate;

a second optical member confronting the substrate so as to deviate light incident thereto from the substrate towards a third optical member;

said third optical member confronting the second optical member so as to deviate light incident thereto from the second optical member towards the camera; and first and second baffles respectively disposed along the optical paths of the first and second arrays of light sources that occlude the respective arrays and thereby prevent them from being imaged onto the second and the third optical members while allowing the indicia to be imaged by the second optical member and deviated, therefrom to the third optical member and thence to the camera allowing it to read the indicia.

2. The invention of claim 1, wherein the first and second arrays of light sources are light emitting diodes.

3. The invention of claim 2, wherein the light emitting diodes are lensed.

4. The invention of claim 2, wherein the first and second arrays of light emitting diodes are constituted by non-lensed light emitting diodes, together with cooperative cylindrical lenses.

5. The invention of claim 1, further including an apertured mask in the nearfield of the first and second arrays of light sources.

6. The invention of claim 1, further including a lens in the near field of the camera.

7. The invention of claim 1, wherein each of the first and second arrays of light sources comprise double rows of light emitting diodes.

8. The invention of claim 7, further including a lightly colored, reflective target located between said first and second arrays of light sources in the field of view of the camera, said reflective target illuminated by at least one incandescent bulb proximate thereto.

9. The invention of claim 7, further including a dark field illumination lamp positioned proximate the indica on the surface of the substrate and occluded from the optical path provided between the first optical member and the substrate.

10. An illumination system for illuminating indicia on the surface of a substrate, comprising:

a camera including a lens, the camera having a field of view that is oriented with its longitudinal axis generally perpendicular to a normal to the substrate;

first and second arrays of light emitting diodes defining optical paths that are respectively disposed to either side of an acute angle defined with respect to a normal to the substrate for illuminating the indicia on the substrate;

a first mirror confronting the first and second arrays of light emitting diodes so as to deviate light incident thereto from the first and second arrays of light emitting diodes towards the substrate;

a second mirror confronting the substrate so as to deviate light incident thereto from the substrate to and towards a third mirror;

said third mirror confronting the second mirror so as to deviate light incident thereto from the second mirror towards the camera; and first and second baffles respectively disposed along the optical paths of the first and second arrays of light emitting diodes, the first and second baffles occluding the respective arrays of light emitting diodes, thereby preventing them from being imaged onto the second and the third mirror while allowing the indicia to be imaged by the second mirror and deviated therefrom to the third mirror and thence to the camera allowing it to read the indicia.

11. The invention of claim 10, further including an apertured mask in the nearfield of the first and second arrays of light emitting diodes.

12. An illumination system for illuminating indicia on the surface of a substrate, comprising:

a camera including a lens, the camera having a field of view that is oriented with its longitudinal axis generally perpendicular to a normal to the substrate;

first and second arrays of light emitting diodes arranged in double rows and defining optical paths that are respectively disposed to either side of an acute angle defined with respect to a normal to the substrate for illuminating the indicia on the substrate;

a first mirror confronting the first and second arrays of light emitting diodes so as to deviate light incident thereto from the first and second arrays of light emitting diodes towards the substrate;

a second mirror confronting the substrate so as to deviate light incident thereto from the substrate towards a third mirror;

said third mirror confronting the second mirror so as to deviate light incident thereto from the second mirror towards the camera;

first and second baffles respectively disposed along the optical paths of the first and second arrays of light emitting diodes, the first and second baffles occluding the respective arrays of light emitting diodes, thereby preventing them from being imaged onto the second and the third mirror while allowing the indicia to be imaged by the second mirror and deviated therefrom to the third mirror and thence to the camera allowing it to read the indicia;

a lightly colored, reflective target located between said first and second arrays of light emitting diodes in the field of view of the camera, said reflective target illuminated by at least one incandescent bulb proximate thereto; and a dark field illumination lamp positioned proximate the indica on the surface of the substrate and occluded from the optical path provided between the first mirror and the substrate.

* * * * *